US011353605B2

(12) United States Patent
Zheng et al.

(10) Patent No.: US 11,353,605 B2
(45) Date of Patent: *Jun. 7, 2022

(54) HOUSING FOR SHIELDING A SENSOR FROM A RADIOFREQUENCY FIELD AND AN IMAGING SYSTEM INCLUDING THE SAME

(71) Applicant: SHANGHAI UNITED IMAGING HEALTHCARE CO., LTD., Shanghai (CN)

(72) Inventors: Jiaxu Zheng, Shanghai (CN); Lingzhi Hu, Houston, TX (US); Tuoyu Cao, Houston, TX (US); Tianyi Zeng, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/133,688

(22) Filed: Dec. 24, 2020

(65) Prior Publication Data

US 2021/0116589 A1  Apr. 22, 2021

Related U.S. Application Data

(63) Continuation of application No. 16/378,513, filed on Apr. 8, 2019, now Pat. No. 10,914,850.

(30) Foreign Application Priority Data

Apr. 11, 2018 (CN) .......................... 201810322546.7

(51) Int. Cl.
*G01T 7/00* (2006.01)
*G01R 33/42* (2006.01)
(Continued)

(52) U.S. Cl.
CPC ................ *G01T 7/00* (2013.01); *G01R 33/42* (2013.01); *G01R 33/481* (2013.01); *G01T 1/2985* (2013.01)

(58) Field of Classification Search
CPC ....... G01T 7/00; G01T 1/2985; G01T 1/1603; G01R 33/42; G01R 33/481; G01R 33/422; G01R 33/3815
See application file for complete search history.

(56) References Cited

U.S. PATENT DOCUMENTS

2012/0229141 A1  9/2012 Brown et al.
2013/0284936 A1  10/2013 McBroom et al.
(Continued)

FOREIGN PATENT DOCUMENTS

CN    101856229 A    10/2010
CN    203691857 U     7/2014
(Continued)

OTHER PUBLICATIONS

First Office Action in Chinese Application No. 201810322546.7 dated Feb. 3, 2020, 25 pages.
(Continued)

*Primary Examiner* — Daniel R Miller
(74) *Attorney, Agent, or Firm* — Metis IP LLC

(57) ABSTRACT

A housing for shielding a sensor from a radiofrequency field and an imaging system including the same are provided in the present disclosure. The imaging system may include a magnetic resonance imaging (MRI) device. The housing may include a plurality of walls forming at least a part of a cavity for accommodating a sensor of the imaging system. At least one of the plurality of walls may include a substrate and a multi-layered structure disposed on the substrate. The multi-layered structure may include a plurality of metallic layers. At least one pair of adjacent layers of the plurality of (Continued)

metallic layers may include slits. The slits of the at least one pair of adjacent layers may be staggered.

20 Claims, 9 Drawing Sheets

(51) Int. Cl.
    *G01R 33/48*     (2006.01)
    *G01T 1/29*     (2006.01)

(56) References Cited

U.S. PATENT DOCUMENTS

| | | | |
|---|---|---|---|
| 2014/0253122 A1* | 9/2014 | Leussler | G01R 33/4215 324/309 |
| 2016/0161578 A1 | 6/2016 | Weissler et al. | |
| 2017/0014644 A1 | 1/2017 | Shvartsman et al. | |
| 2017/0299675 A1 | 10/2017 | Rigla Perez et al. | |
| 2018/0028092 A1 | 2/2018 | Okamoto et al. | |
| 2018/0132376 A1 | 5/2018 | Shin et al. | |

FOREIGN PATENT DOCUMENTS

| | | |
|---|---|---|
| CN | 205320460 U | 6/2016 |
| CN | 205787069 U | 12/2016 |
| CN | 107167748 A | 9/2017 |
| CN | 206728504 U | 12/2017 |
| WO | 2018224065 A1 | 12/2018 |

OTHER PUBLICATIONS

Arne Berneking et al., Design and Characterization of a Gradient-Transparent RF Copper Shield for PET Detector Modules in Hybrid MR-PET Imaging, IEEE Transactions on Nuclear Science, 64(5): 1118-1127, 2017.

* cited by examiner

700

800

HOUSING FOR SHIELDING A SENSOR FROM A RADIOFREQUENCY FIELD AND AN IMAGING SYSTEM INCLUDING THE SAME

CROSS-REFERENCE TO RELATED APPLICATIONS

This application is a continuation of U.S. patent application Ser. No. 16/378,513, filed on Apr. 8, 2019, which claims priority of Chinese Patent Application No. 201810322546.7 filed on Apr. 11, 2018, the entire contents of which are hereby incorporated by reference.

TECHNICAL FIELD

This present disclosure relates to an imaging system, and more particularly, relates to a magnetic resonance (MR)-positron emission tomography (PET) imaging system.

BACKGROUND

Magnetic resonance (MR)-positron emission tomography (PET) is a hybrid imaging technique that incorporates both MR (e.g., a soft tissue morphological imaging technique) and PET (e.g., a functional imaging technique). In a conventional MR-PET imaging scanner, components for PET imaging (e.g., a plurality of PET detection units) and components for MR imaging (e.g., an RF coil assembly, a magnet assembly, a gradient magnet assembly) may be integrated. For example, PET detection modules may be mounted on a supporting component (e.g., a cylindrical supporting component), and be placed between an RF coil and a gradient magnet of the MR system.

The performance of an MR-PET scanner may greatly influent the imaging result. For example, the PET detection units of the MR-PET scanner may greatly affect the performance of the PET imaging. During an imaging process by the MR-PET scanner, the PET detection units may operate in a varying magnetic field and a varying radio frequency (RF) field caused by the components for MR imaging. As the RF field may interfere with the normal operation of a PET detection unit, in the MR-PET scanner, a shielding housing may be set to enclose one or more of the PET detection units to shield them from the RF field, thereby reducing the interference.

A traditional shielding housing for a PET detection unit may include walls disposed with copper foil and/or any other proper metallic material to achieve the RF shielding. However, in the varying magnetic field, the copper foil or the other metallic material adopted may cause a remarkable amount of eddy currents on the walls of the housing. The eddy currents may greatly interfere with the varying magnetic field, thereby reducing the performance of the MR imaging. Besides, the eddy currents may also generate a huge amount of heat, which may reduce the reliability of the MR-PET scanner.

Therefore, it is desirable to provide a shielding housing that may provide a good RF shielding for the PET detection unit(s) and reduce the eddy currents resulting from the varying magnetic field, so as to improve the performances of the MR-PET scanner.

SUMMARY

According to an aspect of the present disclosure, a housing in an imaging system is provided. The imaging system may include a magnetic resonance imaging (MRI) device. The housing may include a plurality of walls forming at least a part of a cavity for accommodating a sensor of the imaging system. At least one of the plurality of walls may include a substrate and a multi-layered structure disposed on the substrate. The multi-layered structure may include a plurality of metallic layers. At least one pair of adjacent layers of the plurality of metallic layers may include slits. The slits of the at least one pair of adjacent layers may be staggered.

In some embodiments, each pair of adjacent layers of the plurality of metallic layers may include slits, and the slits of each pair of adjacent layers are staggered.

In some embodiments, the multi-layered structure may further include an electric insulation layer between the at least one pair of adjacent layers.

In some embodiments, the slits of each of the at least one pair of adjacent layers may include: a plurality of first slits each of which extends along a first direction; and a plurality of second slits each of which extends along a second direction, wherein the first direction and the second direction are different.

In some embodiments, the plurality of the second slits may be set on either side of the first direction of the plurality of first slits.

In some embodiments, two of the plurality of second slits and two of the plurality first slits may together form an enclosing shape or a part thereof.

In some embodiments, the slits of each of the at least one pair of adjacent layers may include a plurality of third slits each of which is in a form of an enclosing shape or a part thereof. The enclosing shapes formed by the plurality of third slits are nested.

In some embodiments, the substrate may include carbon fibers.

In some embodiments, the plurality of metallic layers may include at least one material of gold, silver, copper, or aluminum.

In some embodiments, the multi-layered structure may further include a protection layer disposed on the outermost layer of the plurality of metallic layers.

In some embodiments, the sensor may be a positron emission tomography (PET) detector, imaging system may be a multi-modality imaging system, and the housing may further include a mounting structure configured to mount the housing on the multi-modality imaging system.

According to another aspect of the present disclosure, an MR-PET imaging system is provided. The MR-PET imaging system may include a magnet assembly, an RF coil assembly, a supporting component, and a plurality of PET detection modules. The magnet assembly may be configured to generate a static magnetic field, wherein the magnet assembly may form a first hollow cylinder providing a first inner space. The RF coil assembly may be configured to generate a radio frequency (RF) field for MR imaging. The supporting component may be inside the first inner space. The plurality of PET detection modules may be supported on the supporting component. Each of the plurality of PET detection modules may include at least one PET detection unit and a housing. The housing may be configured to shield the at least one PET detection unit from the RF field. The housing may include a plurality of walls forming at least a part of a cavity for accommodating the at least one PET detection unit. At least one of the plurality of wall may include a substrate and a multi-layered structure disposed on the substrate. The multi-layered structure may include a plurality of metallic layers. At least one pair of adjacent layers of the plurality of metallic layers may include slits, and the slits of the at least one pair of adjacent layers may be staggered.

In some embodiments, the supporting component may form a second hollow cylinder providing a second inner space. The plurality of PET detection modules may be mounted on the outer surface of the second hollow cylinder. The RF coil assembly may be disposed within the second inner space.

According yet to another aspect of the present disclosure, a method for manufacturing a housing is provided. The housing may include a plurality of slit walls forming at least a part of a cavity for accommodating a sensor. The method may include, for each of the plurality of slit walls: providing a substrate of the slit wall, and forming a multi-layered structure on the substrate. The multi-layered structure may include a plurality of metallic layers. The forming a multi-layered structure may include: disposing a first metallic layer on the substrate; forming a first plurality of slits on the first metallic layer; disposing a first electric insulation layer on the first metallic layer; disposing a second metallic layer on the first electric insulation layer; and forming a second plurality of slits on the second metallic layer. The second plurality of slits and the first plurality of slits may be staggered.

In some embodiments, the disposing a multi-layered structure may further include: disposing a second electric insulation layer on the second metallic layer; disposing a third metallic layer on the second electric insulation layer; and forming a third plurality of slits on the third metallic layer. The third plurality of slits and the second plurality of slits may be staggered.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTIONS OF THE DRAWINGS

The present disclosure is further described in terms of example embodiments. These example embodiments are described in detail with reference to the drawings. These embodiments are non-limiting examples, in which like reference numerals represent similar structures throughout the several views of the drawings, and wherein.

DETAILED DESCRIPTION

Figure 1:
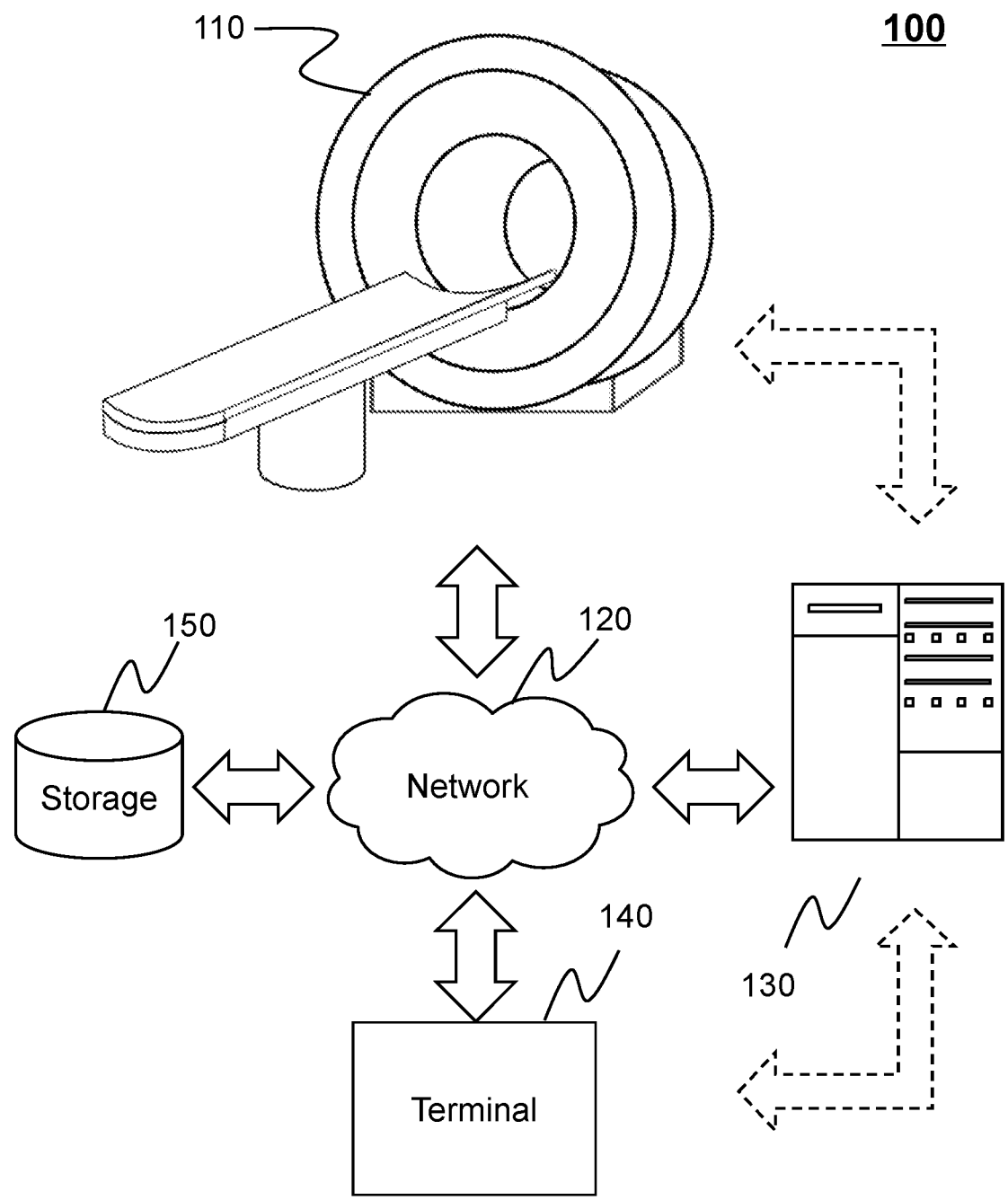
FIG. 1 is a schematic diagram illustrating an exemplary imaging system according to some embodiments of the present disclosure.

The present disclosure provide a housing for shielding the electric instrument therein from electromagnetic waves. The housing is also specifically configured to reduce its eddy effect in exterior magnetic fields. The housing may include one or more walls each of which is disposed with a multi-layered structure. The multi-layered structure may include a plurality of overlapping metallic layers for shielding the electric instrument from the electromagnetic waves. The plurality of overlapping metallic layers may each include one or more slits configured to reduce the eddy effect thereof. The slits of adjacent metallic layers may be staggered to prevent the leakage of the electromagnetic waves. Such a housing may be introduced into an MR-PET system and serve as the housing of PET detection components. In such a system, the housing may shield the PET detection components from exterior RF fields with reduced eddy currents in the exterior magnetic fields during an MR-PET imaging, thereby improving the imaging performance.

The following description is presented to enable any person skilled in the art to make and use the present disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise", "comprises", and/or "comprising", "include", "includes", and/or "including", when used in this specification, specify the presence of stated features, integers, steps, operations, elements, and/or components, but do not preclude the presence or addition of one or more other features, integers, steps, operations, elements, components, and/or groups thereof.

It will be understood that the terms "layer," "surface," "slit," "ring," etc., when used in this disclosure, refer to one or more parts with one or more specific purposes. However, a structure that may perform a same or similar function compared to a part exemplified above or referred to elsewhere in the present disclosure may be named differently from the present disclosure.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

Spatial and functional relationships between elements (for example, between layers) are described using various terms, including "connected," "attached," and "mounted." Unless explicitly described as being "direct," when a relationship between first and second elements is described in the present disclosure, that relationship includes a direct relationship where no other intervening elements are present between the first and second elements, and also an indirect relationship where one or more intervening elements are present (either spatially or functionally) between the first and second elements. In contrast, when an element is referred to as being "directly" connected, attached, or positioned to another element, there are no intervening elements present. Other words used to describe the relationship between elements should be interpreted in a like fashion (e.g., "between," versus "directly between," "adjacent," versus "directly adjacent").

It should also be understood that terms such as "top," "bottom," "upper," "lower," "vertical," "lateral", "longitudinal" "above," "below," "upward(s)," "downward(s)," "left," "right," and other such spatial reference terms are used in a relative sense to describe the positions or orientations of certain surfaces/parts/components of the apparatus in relationship to other such features of the apparatus when the apparatus is in a normal operating position, and may change if the position or orientation of the apparatus changes.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure.

FIG. 1 is a schematic diagram illustrating an exemplary imaging system 100 according to some embodiments of the present disclosure. The imaging system 100 may include an MR-PET scanner 110, a network 120, a data processing device 130, one or more terminals 140, and a storage device 150.

The MR-PET scanner 110 may be an apparatus for scanning a subject so as to generate a scan image, such as an MR image, a PET image, or an MR-PET image of the subject. As used herein, the term "image" may generally refer to a normal image, a video, a video frame, a spectrum, or the like, or a combination thereof. The image may be a two-dimensional (2D) image, a three-dimensional (3D) image, or an image of a higher dimension. The subject may include a biological object and/or a non-biological object. For example, a biological object may be a human being, an animal, a plant, or the like, or a portion thereof (e.g., a cell, a tissue, an organ). A non-biological object may be or may include a radioactive ore, an antique, luggage, etc. The MR-PET scanner 110 may obtain scan data of the subject via the scanning. The data processing device 130 may obtain the scan data from the MR-PET scanner 110 and process the scan data to obtain the corresponding image.

The MR-PET scanner 110 may include a first set of scanning components for MR imaging and a second set of scanning components for PET imaging. The first set of scanning components and the second set of scanning components may operate individually or concurrently to obtain scan data of the subject. When only one set of scanning components performs the scanning on the subject, the resulting scan image may be either an MR image or a PET image. When the two sets of scanning components perform the scanning concurrently or collaboratively, both an MR image and a PET image of the subject may be obtained via a single scanning. Then an MR-PET image may be obtained by fusing the MR image and the PET image.

Figure 2:
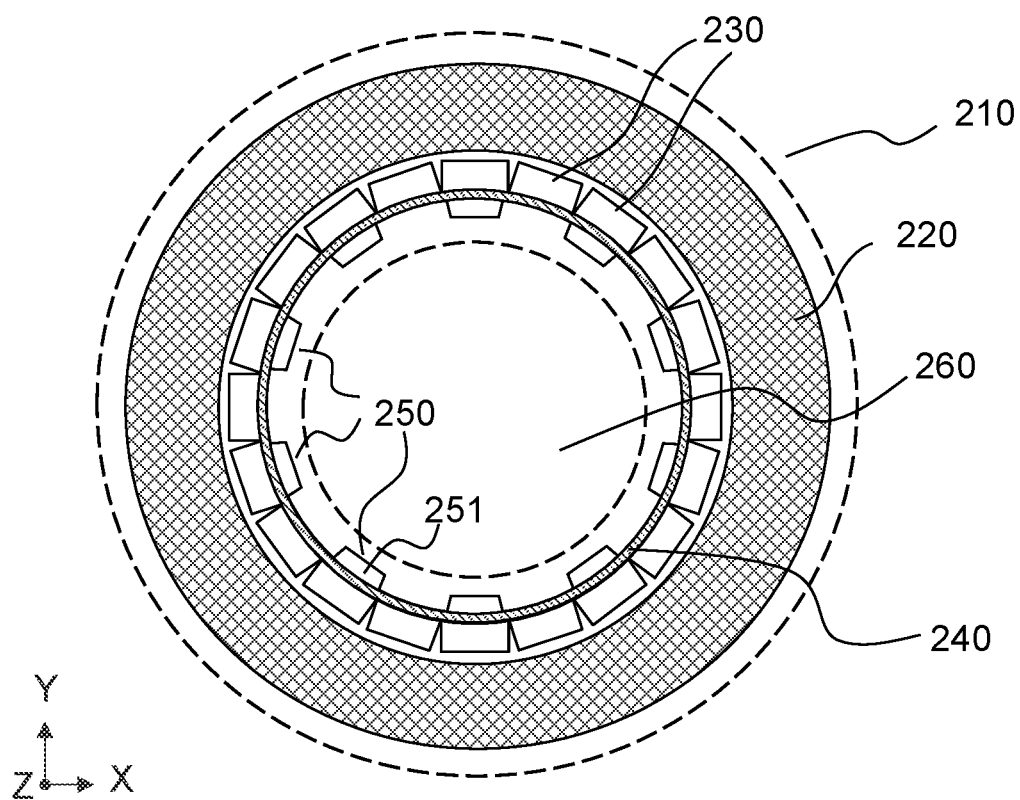
FIG. 2 is a cross-sectional view of an exemplary MR-PET scanner according to some embodiments of the present disclosure.

Detailed descriptions of the MR-PET scanner 110 may be found elsewhere in the present disclosure (e.g., in connection with FIG. 2).

The network 120 may include any suitable network that can facilitate the exchange of information and/or data for the imaging system 100. Components of the imaging system 100 (e.g., the MR-PET scanner 110, the terminal 140, the data processing device 130, the storage device 150) may communicate information and/or data with each other via the network 120. The network 120 may be a wired network (e.g., an Ethernet network), a wireless network (e.g., a cellular network, a Wi-Fi network), or the like or a combination thereof. In some embodiments, the network 120 may further include one or more network access points such as base stations and/or internet exchange points.

The data processing device 130 may process data and/or information obtained from the MR-PET scanner 110, the terminal 140, and/or the storage device 150. For example, the data processing device 130 may be configured to process the scan data acquired by the MR-PET scanner 110 and generate a scan image therefrom. For example, the scan data may be MR scan data or PET scan data, and the scan image may be an MR image or a PET image. As another example, the scan data may include MR scan data and PET scan data that are obtained concurrently, and the scan image may be an MR-PET image obtained by fusing the corresponding MR image and PET image. The data processing device 130 may also be configured to control one or more components of the imaging system 100. For example, the data processing device 130 may be configured to control the MR-PET scanner 110 to scan a subject for MR/PET/MR-PET imaging. As used herein, the term "image" may generally refer to a normal image, a video, a video frame, a spectrum, or the like, or a combination thereof. The image may be a two-dimensional (2D) image, a three-dimensional (3D) image, or an image of a higher dimension.

The terminal 140 may be configured to display information to a user and/or receive instructions of the user. For example, the terminal 140 may receive instructions for MR-PET imaging from a user, transmit the instructions to the data processing device 130 to initiate a scanning by the MR-PET scanner 110, and display the obtained MR-PET image to the user. The terminal 140 may include a mobile phone, a tablet computer, a laptop computer, a wearable device, a virtual reality device, an augmented reality device or the like, or any combination thereof. In some embodiments, the terminal 140 may be a part of the data processing device 130, such as a remote controller of the data processing device 130, a display screen, a mouse, a keyboard, a microphone, a loudspeaker, or the like, or a combination thereof.

The storage device 150 may store any data and/or instructions associated with the imaging system 100. For example, the storage device 150 may store scan data or scan images obtained by the imaging system 100. As another example, the storage device 150 may store instructions to be executed by the data processing device 130 for processing scan data obtained by the MR-PET scanner 110.

It is noted that the above descriptions about the imaging system 100 are only for illustration purposes, and not intended to limit the present disclosure. After learning the major concept and the mechanism of the present disclosure, a person of ordinary skill in the art may alter the imaging system 100 in an uncreative manner. The alteration may include combining and/or splitting modules or sub-modules, adding or removing optional modules or sub-modules, etc. In some embodiments, the MR-PET scanner 110 may also be another multi-modality imaging system including a device (or component) for MR imaging. All such modifications are within the protection scope of the present disclosure.

FIG. 2 is a cross-sectional view of an exemplary MR-PET scanner 110 according to some embodiments of the present disclosure. As shown in FIG. 2, the MR-PET scanner 110 may include a housing 210 (e.g., broken lines in FIG. 2), a magnet assembly 220, a plurality of PET detection modules 230, a supporting component 240, an RF coil assembly 250, and a gradient coil assembly (not shown in FIG. 2). The housing 210 may enclose other components of the MR-PET scanner 110 for protection. The magnet assembly 220, the RF coil assembly 250, and the gradient coil assembly may be for MR imaging. The plurality of PET detection modules 230 may be for PET imaging and may be disposed in the form of one or more PET detection rings.

The magnet assembly 220 may be configured to generate a static magnetic field (or be referred to as a main magnetic field) in a detection region 260 in which a subject (or at least a part of it) to be scanned is placed. The static magnetic field may polarize the subject for MR imaging. The magnet assembly 220 may be or may include a permanent magnet, a superconducting electromagnet, a resistive electromagnet, etc. The magnet assembly 220 may have any magnetic field intensity, for example, 0.2 Tesla, 0.5 Tesla, 1.0 Tesla, 1.5 Tesla, and 3.0 Tesla. In some embodiments, the magnet assembly 220 may further include shim coils (not shown in FIG. 2) for enhancing the homogeneity of the magnetic field.

As shown in FIG. 2, the magnet assembly 220 may form a hollow cylinder (first hollow cylinder) and provide an inner space (first inner space). The plurality of PET detection modules 230, the supporting component 240, the RF coil assembly 250, and the detection region 260 may be inside the first inner space.

The gradient coil assembly may generate magnetic field gradient pulses for localizing MR signals (e.g., for phase encoding or frequency encoding). The magnetic field gradient pulses may be in the X direction, the Y direction, and/or the Z direction (e.g., as illustrated in FIG. 2), and may form one or more gradient magnetic fields. The gradient coil assembly may form part of the magnet assembly 220 or be independent of the magnet assembly 220.

The supporting component 240 may be configured to support one or more components of the MR-PET scanner 110, such as the PET detection modules 230. In some embodiments, the supporting component 240 may also form a hollow cylinder (second hollow cylinder) and provide an inner space (second inner space), as shown in FIG. 2. The RF coil assembly 250 and the detection region 260 may be inside the second inner surface, and the PET detection modules 230 may be outside the second inner surface.

The supporting component 240 may have an inner surface facing the detection region 260 and an outer surface away from the detection region 260. The outer surface of the supporting component 240 may include a region for mounting the PET detection modules 230. In some embodiments, the supporting component 240 may be configured further to support the RF coil assembly 250, and the inner surface of the supporting component 240 may include a region for mounting the RF coil assembly 250.

Figure 3:
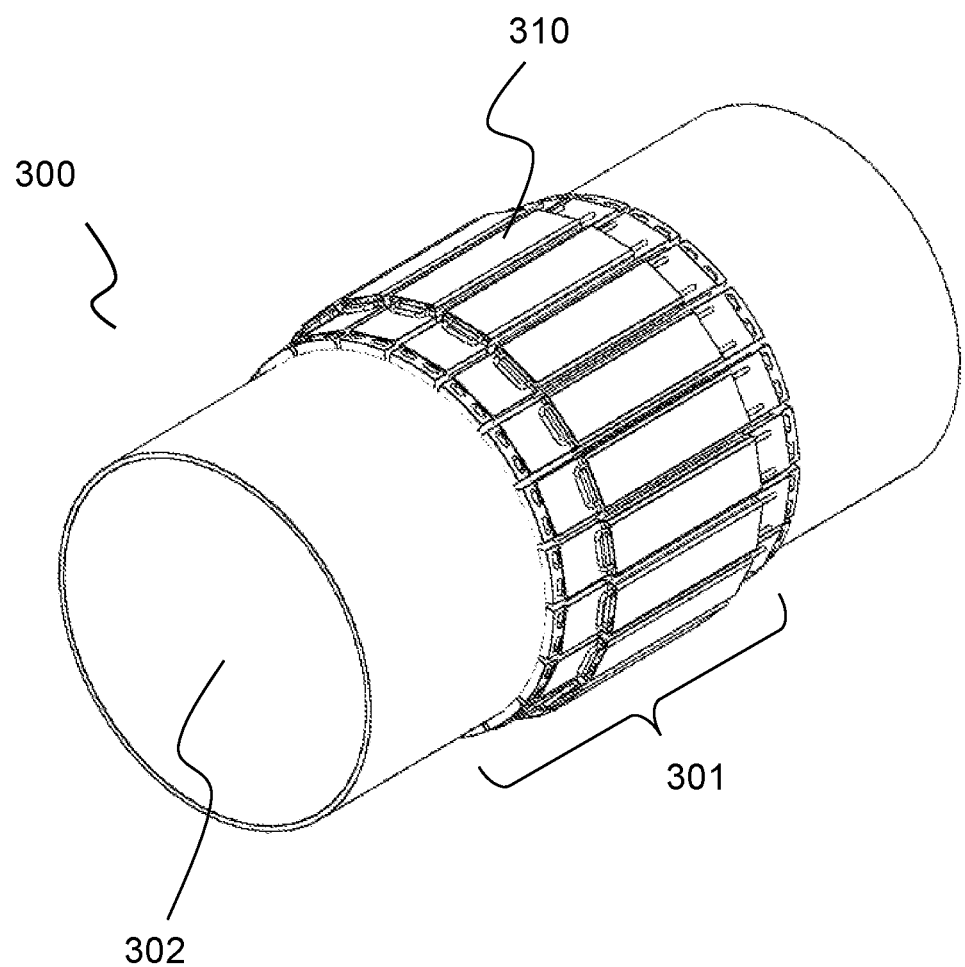
FIG. 3 is a schematic diagram illustrating an exemplary supporting component mounted with PET detection modules of an MR-PET scanner according to some embodiments of the present disclosure.

More descriptions of the supporting component 240 may be found elsewhere in the present disclosure (e.g., FIG. 3 and descriptions thereof).

The RF coil assembly 250 may generate radio frequency (RF) pulses to excites the subject and receive the MR signals responding to the RF pulses. The MR signals detected by the RF coil assembly 250 may be used to generate MR scan data, e.g., in the form of one or more K-space datasets. The MR scan data may further be processed by the data processing device 130 to generate an MRI image. The RF pulses emitted by the RF coil assembly 250 may form an RF field.

The RF coil assembly 250 may include a quotient difference (QD) orthogonal coil and/or a phase-array coil. In some embodiments, the RF coil assembly 250 may include a volume coil and/or a local coil. For example, the volume coil may include a dipole coil, a birdcage coil, a transverse electromagnetic coil, a loop coil, a surface coil, etc. The local coil may include a solenoid coil, a saddle coil, a flexible coil, etc. In some embodiments, the RF coil assembly 250 may include a plurality of different types of RF coils for scanning different parts of the subject (e.g., a patient).

In some embodiments, the RF coil assembly 250 may include a plurality of coil units (e.g., the coil unit 251 as shown in FIG. 2). For example, the RF coil assembly 250 may be or may include a birdcage coil, which may be formed by two circular conductive loops (or be referred to as end rings) connected by a plurality of conductive straight elements (or be referred to as rungs or legs). The rungs of the birdcage coil may be the plurality of coil units. The plurality of coil units may be arranged around the supporting component 240 in a suitable configuration. For example, the plurality of coil units may be arranged around the inner surface of the supporting component 240 (e.g., as shown in FIG. 2). In some embodiments, the plurality of coil units may be uniformly arranged around the inner surface of the supporting component 240. Accordingly, the RF fields generated by the RF coil assembly 250 may be uniform, providing a good basis for MR imaging.

The PET detection modules 230 may be configured to detect radiation events in the subject so as to generate a PET image. For example, during a PET imaging, a radioactive tracer (e.g., fluorine-18) may be introduced into the subject to be scanned. The radioactive tracer may decay and emit positrons. The positrons may encounter with electrons in the nearby environment of the subject and produce a pair of annihilation photons (e.g., gamma photons) with opposite propagation direction. This event may be referred to as an annihilation event. A PET detection module 230 may include one or more PET detection units, each of which may generate an electric signal in response to a received annihilation photon. In some embodiments, each PET detection unit may include a scintillator and a photovoltaic convertor (e.g., a photomultiplier tube, a silicon avalanche photodiode). The scintillator may generate an optical signal (e.g., a burst of light) when receiving an annihilation photon. The photovoltaic convertor may detect the optical signal and generate a corresponding electric signal. Electric signals generated by the PET detection modules 230 may be used to generate PET scan data, which may be further processed by the data processing device 130 for generating a PET image.

In some specific embodiments, when the subject is placed in the detection region 260, at least part of the subject may be surrounded by the one or more PET detection rings formed by the plurality of PET detection modules 230. As the radioactive tracer decays, the resulting positrons subsequently annihilate on contact with nearby electrons, and each annihilation may produce a pair of annihilation photons propagating in opposite directions. Annihilation photons emitted from the subject may be detected by PET detection units of the plurality of PET detection modules 230 as corresponding detection events. Two detection events that are detected by PET detection units in opposite directions and unambiguously occur within a certain time window may be recognized (e.g., by the MR-PET scanner 110 or the data processing device 130) to be coincident, and thus are determined to have come from the same annihilation. These coincidence events can be stored in arrays corresponding to projections through the target body and reconstructed using tomographic technologies to generate PET images.

The PET detection unit(s) of the PET detection module 230 may be sensitive to the RF field generated by the RF coil assembly 250. To reduce the interference of the RF field on the PET imaging, each of the plurality of PET detection module 230 may include a housing for shielding the one or more PET detection units thereof from the RF field. The housing may include a plurality of walls forming at least a part of a cavity for accommodating the one or more PET detection units. The one or more PET detection units may be covered or enclosed by the housing. The housing may allow the passing of annihilation photons and block (or absorb) RF fields generated by the RF coil assembly 250.

In traditional arts, the housing for shielding the PET detection units from the RF field may include metallic walls, or have one or more metallic layers disposed on the walls thereof. However, in a PET-MR imaging system, magnetic fields generated by the magnetic assembly 220 and the gradient coil assembly may induce eddy currents in metallic materials, such as the walls of the housing, which may in turn distort the applied magnetic fields. Thus, the MR imaging may be affected. Particularly, eddy currents are loops of electrical current induced within conductors by a varying magnetic field in the conductor, and may flow in planes perpendicular to the magnetic field that induced the eddy currents. By Lenz's law, an eddy current creates a magnetic field that opposes the magnetic field that created it. Thus, eddy currents react back on the source of the magnetic field. For example, magnetic fields created by eddy currents may impact on the homogeneity of the main magnetic field generated by the magnet assembly 220, and distort the gradient magnetic fields created by gradient coils assembly. As a result, a wide range of image artifacts may be produced, which may include shearing, shading, scaling, blurring, and spatial misregistration, etc.

Further, eddy currents flowing through conductive materials may dissipate energy as heat in the conductor. The heat dissipated by the eddy currents may increase the working temperature of the PET detection units covered or enclosed by the housing, thereby affecting the performance of the PET imaging. Besides, in the traditional arts, the walls of the housing may be copper foils or be disposed with copper foils for blocking or absorbing the RF fields. The heat dissipated by the eddy currents may cause the copper foils to bulge, or even be broken, thereby reducing the shielding performance of the housing.

Therefore, in the present disclosure, a housing for shielding the PET detection units (or any other detectors) from the RF field with a reduced eddy effect is provided, which may be further described in the following part of the present disclosure. Such a housing may be adopted as the housing of each of the plurality of PET detection modules 230. Briefly, the housing may include a plurality of walls. One or more of the plurality of walls, such as the one (or ones) perpendicular to the magnetic field generated by the magnet assembly 220 or the gradient coil assembly, and/or the one(s) having a larger area compared to the others, may be specifically configured to reduce the eddy effect thereof. Such a specifically configured wall may be referred to as a slit wall, as there are a plurality of slits set on the wall to reduce its eddy effect. The slit wall may include a plurality of metallic layers. At least one pair of adjacent layers of the plurality of metallic layers may include slits, and the slits of the at least one pair of adjacent layers may be staggered.

In some embodiments, all the walls of the housing may be slit walls.

It is noted that the above descriptions about the MR-PET scanner 110 are only for illustration purposes, and not intended to limit the present disclosure. Several parts of the MR-PET scanner 110, such as a gantry for supporting the components of the MR-PET scanner 110, the power system, the cooling system, the signal transmission system, the control system, etc., are not illustrated in FIG. 2. It is also understood that, after learning the major concept and the mechanism of the present disclosure, a person of ordinary skill in the art may alter the MR-PET scanner 110 in an uncreative manner. The alteration may include combining and/or splitting modules or sub-modules, adding or removing optional modules or sub-modules, etc. All such modifications are within the protection scope of the present disclosure.

FIG. 3 is a schematic diagram illustrating an exemplary supporting component 300 mounted with PET detection modules 310 of an MR-PET scanner according to some embodiments of the present disclosure. The supporting component 300 may be an example of the supporting component 240 illustrated in FIG. 2, and the PET detection module 310 may be an example of the PET detection module 230.

The supporting component 300 may be a hollow cylinder. The supporting component 300 may provide an inner space 302 for placing an RF coil assembly (e.g., the RF coil assembly 250 illustrated in FIG. 2). In some embodiments, the RF coil assembly may be mounted on the inner surface of the supporting component 300. The supporting component 300 may also provide a mounting section 301 for mounting the PET detection modules 310 around its outer surface. For example, the mounting section 301 may include a plurality of mounting structures for mounting the PET detection modules 310. The mounting structure may be or may include, for example, a slot, a hole, a block, a screw, a bolt, a clamp, or the like, or a combination thereof.

In some embodiments, the mounting section 301 may have a lower attenuation rate of the annihilation photons than any other section (or be referred to as an unoccupied section) of the supporting component 300. For example, the mounting section 301 and the unoccupied section may be made of different materials. As another example, the thickness of the mounting section 301 may be less than the thickness of the unoccupied section. Such a configuration may facilitate the penetration of the annihilation photons through the mounting section 301 to achieve the PET detection modules 310, thereby improving the PET imaging performance.

In some embodiments, one or more functional components may be integrated into the supporting component 300 or be mounted thereon. For example, the one or more functional components may be for power transmission, data transmission, cooling, signal shielding, or the like, or a combination thereof. In some specific embodiments, the supporting component 300 or the mounting section 301 may include one or more shielding layers (or plates). The one or more shielding layers may be attached on the inner surface (the surface close to the electric instrument) of the supporting component 300, on the outer surface (the surface away from the electric instrument) of the supporting component 300, or be embedded into the supporting component 300. The one or more shielding layers may be configured to block or absorb the RF field generated by the RF coil assembly 250 and may be disposed between the RF coil assembly 250 and the PET detection modules 230. Such a configuration may reduce the interference of the RF field on the PET detection modules. In some embodiments, the shielding layer may have a configuration similar to the aforementioned slit wall of the housing of the PET detection module 230.

Figure 4:
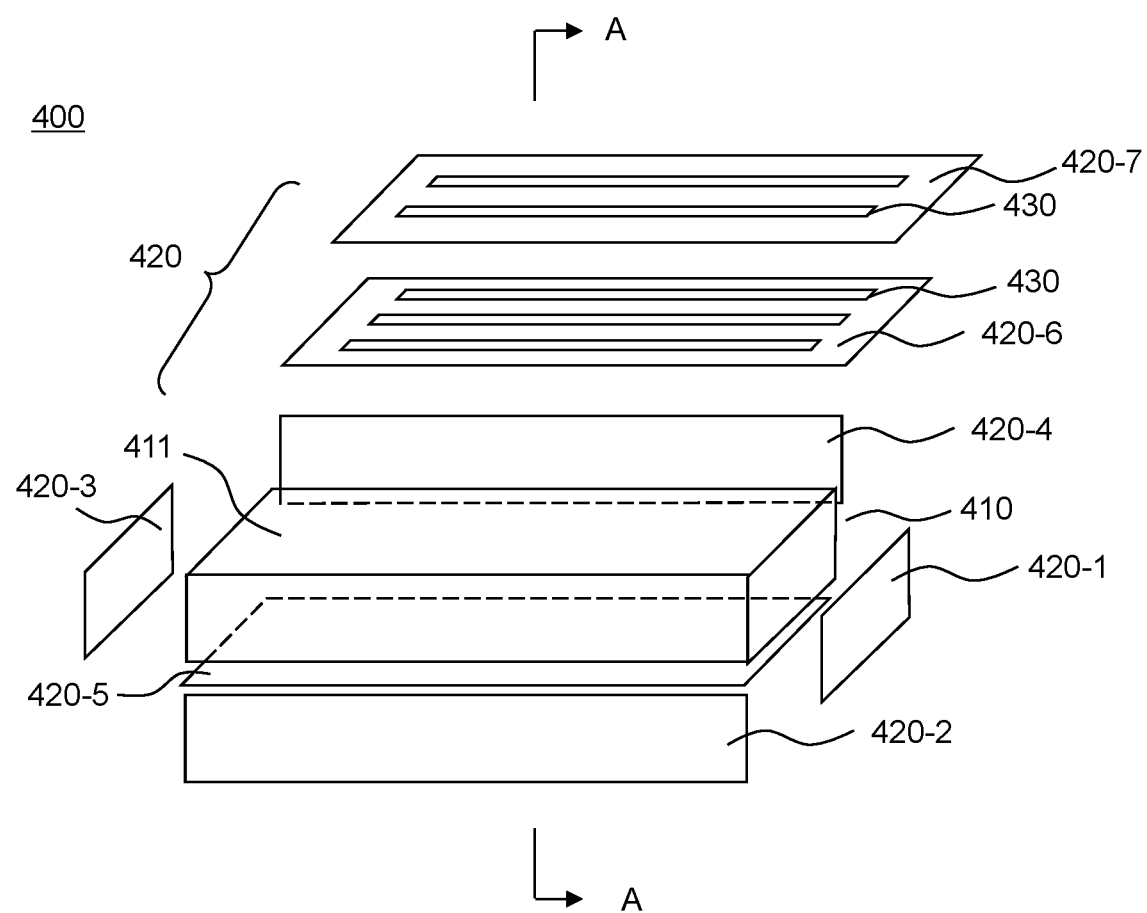
FIG. 4 is a schematic diagram illustrating an exemplary housing according to some embodiments of the present disclosure.

FIG. 4 is a schematic diagram illustrating an exemplary housing 400 according to some embodiments of the present disclosure. The housing 400 may be configured to shield an electric device (or multiple devices) from an RF field with reduced eddy effect. The electric device may be any electric device that may have a risk to operate under both an RF field and a magnetic field and be affected by any one of them. Some examples are described below for demonstration purposes and are not intended to be limiting.

In some embodiments, the electric device may be a sensor (or detector) of an imaging system including an MR imaging device. The sensor may collect signals or data to facilitate the imaging. The MR imaging device may emit an RF field, a main magnetic fields, and/or a gradient magnetic field for MR imaging. For example, the imaging system may be a multi-modality imaging system such as a MR-PET imaging system, the MR imaging device may be a component thereof configured to perform the MR imaging. As another example, the imaging system may be a single-modality imaging system, and the MR imaging device may be a MRI scanner or a functional component thereof.

In some embodiments, the sensor may be the aforementioned PET detection unit(s), and the imaging system may be an MR-PET scanner.

In some embodiments, the sensor may be configured to detect a movement of the subject during the imaging. Data collected by the motion sensor may be used to, for example, perform a corresponding correction on the resulting image so as to reduce artifacts.

In some embodiments, the sensor may be configured to monitor one or more physiology parameters (such as heart rate, blood pressure, body temperature, respiratory rate) of the subject during the imaging.

In some embodiments, the electric device may be another sensitive component of the imaging system to be shielded from the RF fields of the MR imaging device. For example, the electric device may be a battery, a data cable, a chip.

In some embodiments, the electric device may be a functional instrument to be implanted in the body of a patient. For example, the electric device may include a heart pacemaker, a detector, a battery, an electrode, or the like, or a combination thereof. The housing 400 may shield the functional instrument therein from the RF field with reduced eddy effect, allowing the normal operation of the functional instrument when the patient is under an environment with strong RF fields and/or magnetic fields. For example, the housing 400, when being properly designed and/or integrated with any other proper techniques, may allow the patient to take an MR imaging, a PET imaging, or an MR-PET imaging without damaging the functional instrument therein, risking the health or life of the patient, or reducing the imaging performance.

The housing 400 may include a plurality of walls forming at least a part of a cavity for accommodating the electric device. The shape/size of the housing 400 may be set according to actual needs or the shape/size of the electric device therein. For example, when the electric device is rectangular, the housing 400 may also be set as rectangular. In some embodiments, the housing 400 may fully enclose the electric device. In such a case, if the housing 400 is rectangular, it may have six walls in total. Alternatively, the housing 400 and another structure may together form the cavity for accommodating the electric device. For example, when the housing 400 is adopted in the PET detection module 310 and the supporting component 300 also includes one or more layers for blocking or absorbing RF fields, the housing 400 and the supporting component 300 may together form the cavity. In some specific embodiments, the PET detection units of a PET detection module may be directly installed on the supporting component 300, and the housing 400 may be mounted on the supporting component 300 to cover the PET detection units. In such a case, if the housing 400 is rectangular, it may only have five walls in total, and the opening of the housing 400 may be covered by the supporting component 300. In some specific embodiments, the one or more layers for blocking or absorbing RF fields may also have a configuration the same as or similar to that of a slit wall.

In some embodiments, all the walls of the housing 400 may be the aforementioned slit walls configured to reduce the eddy effect thereof. However, such a configuration is not necessary. In some embodiments, one or more walls of the housing 400 that are perpendicular to the magnetic field may be configured as the slit wall, as only these walls are responsible for generating eddy currents. In some embodiments, one or more walls of the housing 400 that are obviously larger than the other walls may be configured as the slit wall, especially when the housing 400 is flat, as these walls make much more contribution to the generation of eddy currents.

For demonstration purposes and not intended to be limiting, in the following part, the housing 400 may be described as a rectangular housing of a PET module in an MR-PET scanner, such as the MR-PET scanner 110 as illustrated in FIGS. 1 and 2. The housing 400 may also be described as fully enclosing the PET detection units. However, it is understood that other proper configurations are also possible.

As shown in FIG. 4, the housing 400 may include a basic housing 410 and a plurality of metallic layers 420 (e.g., layers 420-1 to layers 420-7) disposed on the basic housing 410. The basic housing 410 may be formed by a plurality of walls (or be referred to as substrate walls) and may provide the cavity for accommodating PET detection unit(s). Each substrate wall may be disposed with one or more metallic layers of the plurality of metallic layers 420. A slit wall may be formed by disposing a substrate wall (e.g., wall 411) with multiple metallic layers (e.g., layers 420-6 and 420-7) and optionally one or more other functional layers (e.g., one or more electric insulation layers). The multiple metallic layers may be overlapped. At least one pair of adjacent layers of the plurality of metallic layers 420 may include slits, and the slits of the at least one pair of adjacent layers may be staggered. The disposed layers may form a multi-layered structure on the substrate wall (or be referred to as a substrate for short).

The basic housing 410 may be configured to support the plurality of metallic layers 420. The plurality of metallic layers 420 may be disposed on the outer surface of the basic housing 410, so that the metallic layers may package the basic housing 410 to shield the electric device in the housing 400 from the RF fields. In some embodiments, the electric device may be or may include one or more PET detection units. In some embodiments, the basic housing 410 may be made of any proper materials with sufficient mechanic strength and flexibility, such as epoxy fiberglass, epoxy resin, or the like, or a combination thereof. The material of the basic housing 410 is not limited in the present disclosure. The plurality of metallic layers 420 may be disposed on the basic housing 410 using various techniques, such as thermal spraying, adhesive bonding, pressure lamination, as long as the plurality of metallic layers 420 may be attached to the basic housing 410. The plurality of metallic layers 420 may be made of any non-ferromagnetic metals with good conductivity, such as gold, silver, copper, or the like, or an alloy thereof, or a combination thereof. In some specific embodiments, the plurality of metallic layers 420 may be disposed on the basic housing 210 using a thermal spraying technique, such as a detonation spraying technique or a plasma spraying technique.

Figure 5:
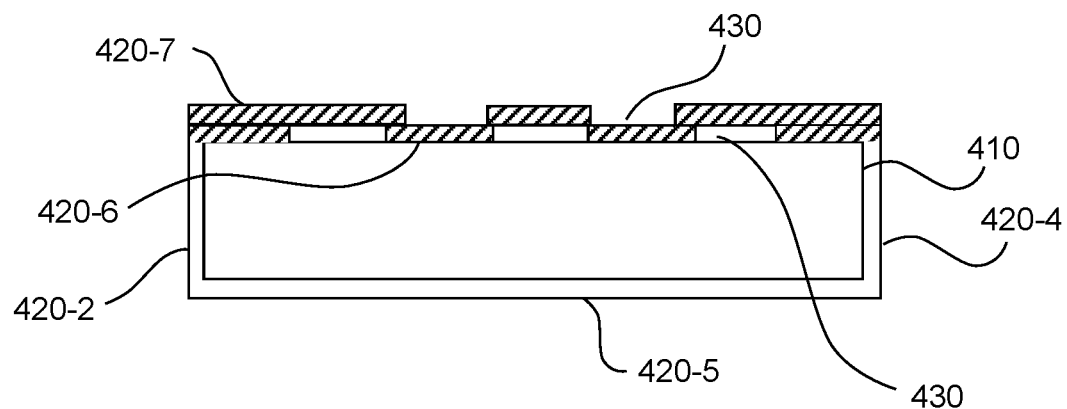
FIG. 5 is a schematic diagram illustrating a sectional view of the housing illustrated in FIG. 4 according to some embodiments of the present disclosure.

Slits 430 may be set or formed on at least some of the plurality of metallic layers 420 (e.g., layers 420-6 and 420-7), so as to cut the closed paths of the eddy currents. An example arrangement of the slits 430 is illustrated in FIG. 5. FIG. 5 is a schematic diagram illustrating a sectional view of the section A-A' of the housing 400 illustrated in FIG. 4 according to some embodiments of the present disclosure. As shown in FIG. 5, the slits 430 of a pair of adjacent metallic layers may be staggered.

A slit 430 set on a metallic layer 420 may extend along the longitudinal direction of the metallic layer 420, or form an arbitrary shape such as a circle, an ellipse, or a rectangle. In some embodiments, a plurality of slits 430 may be set in parallel on the metallic layer 420, so as to cut the closed paths of eddy currents on the housing 400. Consequently, the eddy currents on the metallic layer 420 may be reduced, ensuring the normal operation of the MR-PET imaging system.

Figure 6A:
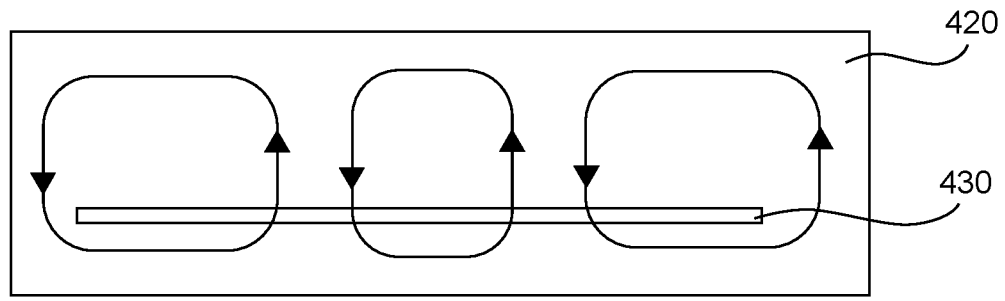
FIG. 6A is a schematic diagram illustrating exemplary closed loops of eddy currents.
Figure 6B:
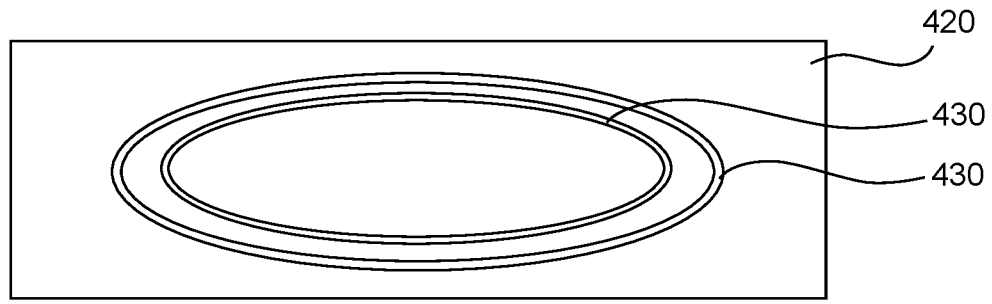
FIG. 6B is a schematic diagram illustrating an exemplary pattern for arranging slits on a metallic layer according to some embodiments of the present disclosure.

As mentioned above, when a metallic layer 420 is in a magnetic field generated by, e.g., the magnet assembly 220 or the gradient coil assembly of the PET-MR scanner 110, induced currents may be generated by the metallic layer 420. The induced currents, or eddy currents, may flow through the metallic layer 420, forming closed loops. The eddy currents may distort the magnetic field, causing the performance of MR imaging to be reduced. The eddy currents may also cause the metallic layer 420 to dissipate heat, which may affect the normal operation of nearby devices, such as the PET detection unit(s) in the housing 400. FIG. 6A is a schematic diagram illustrating exemplary closed loops of eddy currents. As shown in FIG. 6A, by setting slits 430 on the metallic layer 420, the closed loops of eddy currents may be cut, thereby reducing the eddy currents on the metallic layer 420. FIG. 6B is a schematic diagram illustrating an exemplary pattern for arranging slits on a metallic layer according to some embodiments of the present disclosure. As shown in FIG. 6B, the slits 430 may be nested elliptical rings. A slit 430 may have any proper shape, as long as the slit 430 can block the closed loops of eddy currents on the metallic layer 420 to reduce the eddy currents. The shape of a slit 430 is not limited.

In some embodiments, when multiple metallic layers 420 are disposed on a substrate wall of the basic housing 410, the multiple metallic layers 420 may form a multi-layered structure or a part thereof. The multiple metallic layers 420 may be overlapped and be disposed sequentially along the direction of the thickness of the multiple metallic layers 420. At least one pair of adjacent layers of the multiple metallic layers 420 may include slits 430. In some embodiments, each of the multiple metallic layers 420 may include one or more slits 430. The shapes and configurations of the slits 430 may cut closed loops of the eddy currents on the corresponding metallic layers 430. The slits 430 of the at least one pair of adjacent layers may be non-overlapped, or staggered. The positions of the slits 430 on the at least one pair of adjacent layers are described as following.

Figure 7:
FIG. 7 is a schematic diagram illustrating an exemplary pattern for arranging slits on a metallic layer according to some embodiments of the present disclosure.

The number of the layers in the multiple metallic layers 420 may be two, three, or more, which is not limited in the present disclosure. FIG. 7 is a schematic diagram illustrating an exemplary of slit pattern 700 according to some embodiments of the present disclosure. The slit pattern 700 may be referred to as a staggered pattern. For demonstration purposes, three metallic layers 711, 712, and 713 are illustrated in FIG. 7, which are examples of the metallic layers 420. Slits 721, 722, and 723 are set on the metallic layers 711, 712, and 713, respectively, which are examples of the slits 430. As shown in FIG. 7, the metallic layers 711, 712, and 713 may be overlapped. The metallic part of the metallic layer 712 may cover the slits 721 on the metallic layer 711, and the metallic part of the metallic layer 713 may cover the slits 722 on the metallic layer 711. In such a configuration, the slits of the metallic layer 712 and the metallic layer 711 may be said as "staggered", the slits of the metallic layer 713 and the metallic layer 712 are also "staggered". The "staggered" relationship may be mutual. For example, the metallic part of the metallic layer 712 may also cover the slits 723 on the metallic layer 713. The slits of non-adjacent metallic layers e.g., the metallic layer 713 and the metallic layer 711, may be overlapped, partially overlapped, or non-overlapped. When there are more metallic layers with slits, similarly, the slits of one metallic layer and the slits of any adjacent metallic layer thereof may be staggered. That is, the slits of a metallic layer may be covered by the metallic parts of both the adjacent layers thereof.

When only a single metallic layer 420 is presented, the slit(s) 430 thereon may act as a slot antenna, and exterior electromagnetic waves (e.g., RF signals emitted by the RF coil assembly 250) may pass through the slit(s) 430, thereby causing a leakage of the exterior electromagnetic waves. In the present disclosure, the slits 430 of the multiple metallic layers 420 may each act as a slot antenna. By adopting a staggered pattern to set slits 430 on the multiple metallic layers 420, the leakage may be reduced, thereby improving the shielding performance of the housing 400. Take the staggered pattern as shown in FIG. 7 as an example. When passing through the metallic layer 713, exterior electromagnetic waves may be weakened by the metallic layer 713, and only a portion thereof may pass through the slits 723 and reach the adjacent metallic layer 712. Similarly, when passing through the metallic layer 712, the exterior electromagnetic waves may be further weakened by the metallic layer 712, and an even less portion thereof may pass through the slits 722 and reach the metallic layer 711. When the exterior electromagnetic waves pass through the multiple metallic layers 420, the exterior electromagnetic waves may be weakened gradually, and eventually be blocked or absorbed by the multiple metallic layers 420. Therefore, by disposing multiple metallic layers 420 with staggered slits 430 on the housing 400, the eddy effect of the multiple metallic layers 420 may be reduced, as the slits 430 may cut the closed loops of eddy currents on the corresponding metallic layers 420. The leakage of electromagnetic waves (e.g., RF fields) may also be reduced, as adjacent metallic layers 420 may cover the slits 430 of each other, thereby improving the shielding performance of the housing 400.

In some embodiments, the multiple metallic layers 420 may be bound to each other using an adhesive or a pressure lamination equipment. The adopted bonding technique is not limited, as long as the plurality of metallic layers 420 can be bound to each other.

In some embodiments, there may be an electric insulation layer between the at least one pair of adjacent layers that include the slits 430. Alternatively or additionally, a protection layer may be disposed on the outermost layer of the plurality of metallic layers 420. In some specific embodiments, each of the multiple metallic layers 420 of a slit wall of the housing 400 may include one or more slits 430, and then an electric insulation layer may be disposed between each pair of adjacent layers of the multiple metallic layers 420. An exemplary structure is illustrated in FIG. 8.

Figure 8:
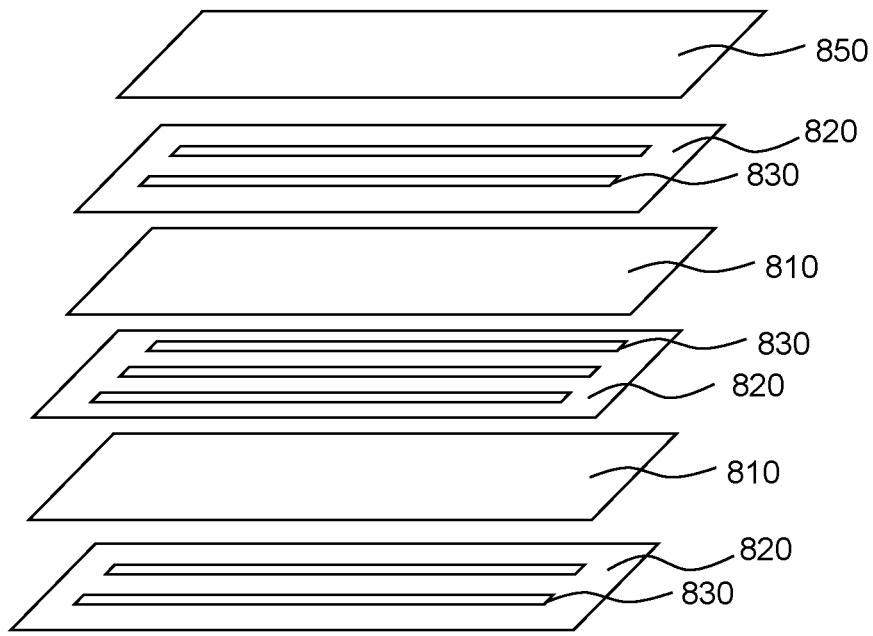
FIG. 8 is a schematic diagram illustrating an exemplary slit wall 800 according to some embodiments of the present disclosure.

FIG. 8 is a schematic diagram illustrating an exemplary slit wall 800 according to some embodiments of the present disclosure. The slit wall 800 may include a plurality of metallic layers 820 with staggered slits 830, wherein each metallic layer 820 may be an example of the metallic layer 420 and include one or more slits 830, and each slit 830 may be an example of the slit 430. The slit wall 800 may also include an electric insulation layer 810 between each pair of adjacent layers of the plurality of metallic layers 820. The slit wall 800 may further include a protection layer 850 (optional) as the outer most layer of the slit wall 800. The plurality of metallic layers 820, the electric insulation layer (s) 810, and the protection layer 850 (optional) may form a multi-layered structure.

The multi-layered structure may be formed on one or more of the substrate walls of the basic housing 410 for RF shielding with reduced eddy effect. It is noted that the multi-layered structure may be formed on only the outer surface of the corresponding substrate wall, only the inner surface of the substrate wall, or on both the inner and outer surfaces of the substrate wall. For demonstration purposes, the substrate upon which the multi-layered structure is formed is not shown in FIG. 8. Although there are three metallic layers 820 shown in FIG. 8, it is understood that the number of the metallic layers 820 may be 2, 3, 4, 5, or any other proper number.

In some embodiments, the multi-layered structure may also include one or more other layers to provide other functionalities, such as heat transferring, mechanic supporting, bonding, shielding from other radiation rays or magnetic fields, biocompatibility, or the like, or a combination thereof.

The electric insulation layer 810 may be a thin film made of one or more electric insulation materials. An electric insulation layer 810 may be bound to an adjacent metallic layer 820 using an adhesive. Alternatively, an electric insulation layer 810 may be formed by spraying (e.g., thermal spraying) the corresponding electric insulation material(s) on a previously formed metallic layer 820. In some embodiments, the material of the electric insulation layer 820 may include resin, plastic, high polymer, or the like, or a combination thereof. In the present disclosure, the material of the electric insulation layer 820 is not limited, as long as the electric insulation layer 820 may cut the electric path that may be formed between adjacent metallic layers 820. In some embodiments, a protection layer 850 may be disposed on the outermost metallic layer 820. The protection layer 850 may be formed by spraying (e.g., thermal spraying) the corresponding material(s) on the outer most layer of the housing 400. Alternatively, the protection layer 850 may be bound to the outer most layer using an adhesive.

In some embodiments, the material of the protection layer may also be electrically insulated. For example, the protection layer 850 and the electric insulation layer(s) 810 may be made of the same material.

In some embodiments, the housing 400, with the electric instrument therein, may be implanted into the body of a patient. The protection layer 850 may be made of a material having good biocompatibility and/or anti-biodegradability to reduce its potential risk to the health of the patient and/or extend its service life.

By disposing electric insulation layers between each pair of adjacent metallic layers 820, electric paths may not be formed between the adjacent metallic layers 820. The interference between eddy currents in different metallic layers may be reduced, and the eddy currents may also be reduced as well. As a result, the influence of the housing 400 on the magnetic fields generated by the magnet assembly 220 and the gradient coil assembly may be reduced, thereby improving the MR imaging performance of the MR-PCT scanner. Further, the heat caused by the eddy currents on the housing

400 may also be reduced, thereby reducing the equipment damage due to the heat, increasing the liability of the PET detection units, and extending the service lives of the PET detection units. The protection layer 850 may also provide extra protection on the housing 400 and extend its service life.

There may be various patterns for setting slits 430 on a metallic layer 420. For demonstration purposes and not intended to be limiting, several examples are provided as following. It is noted that, adjacent metallic layers may preferably have the same or similar patterns for setting the slits. However, it is also possible that adjacent metallic layers have different patterns for setting the slits, as long as the slits of one of the metallic layers are covered by the metallic part of its adjacent metallic layer(s).

Figure 9:
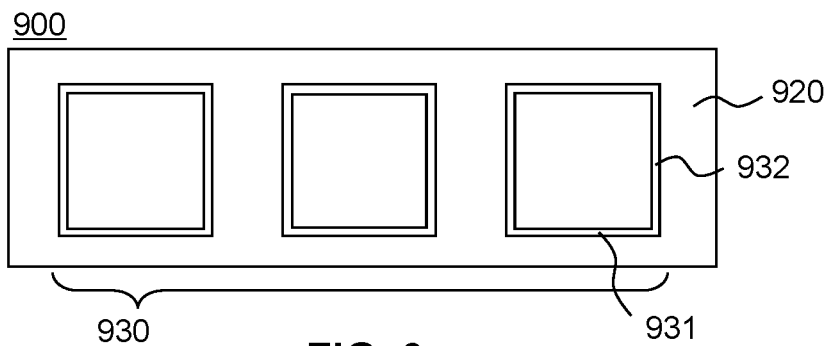
FIG. 9 is a schematic diagram illustrating an exemplary pattern for setting slits on a metallic layer according to some embodiments of the present disclosure.

FIG. 9 is a schematic diagram illustrating an exemplary pattern 900 for setting slits 930 on a metallic layer 920 according to some embodiments of the present disclosure. The slits 930 and the metallic layer 920 may be examples of the slits 430 and the metallic layer 420. The slits 930 may include one or more first slits 931 each of which extends along a first direction. The slits 930 may also include one or more second slits 932 each of which may extend along a second direction. The first slits 931 and the second slits 932 may be strip-like. The first direction and the second direction may be different, i.e., the first direction and the second direction be intersected. In some specific embodiments, the first direction and the second direction may be perpendicular to each other. For example, the first direction may be along the length (i.e., the longer side) of the housing 400, and the second direction may be along the width (i.e., the shorter side) of the housing 400. In some specific embodiments, a first slit 931 may connect to a second slits 932 in an end-to-end manner. Two second slits 932 and two first slits 931 may together form an enclosing shape or a part thereof (e.g., an enclosing shape with one or more small opening). The enclosing shape may be a rectangular (or square) ring, a circular ring, a polygonal ring, etc. For example, as shown in FIG. 9. The one or more first slits 931 and the one or more second slits 932 may together form a plurality of rectangular-ring slits. In some embodiments, the rectangular-ring slits may be side-by-side.

Figure 10:
FIG. 10 is a schematic diagram illustrating an exemplary pattern for setting slits on a metallic layer according to some embodiments of the present disclosure.

FIG. 10 is a schematic diagram illustrating an exemplary pattern 1000 for setting slits 1030 on a metallic layer 1020 according to some embodiments of the present disclosure. The slits 1030 and the metallic layer 1020 may be examples of the slits 430 and the metallic layer 420. The slits 1030 may include one or more strip-like slits 1031 along a first direction. When there are multiple slits 1031, the multiple slits 1031 may be parallel to each other (e.g., as shown in FIG. 10). The spatial distances between the adjacent slits 1031 may be equal or unequal. The lengths of the multiple slits may be equal or unequal. In some embodiments, optionally, the slits 1030 may also include one or more slits 1032 that are perpendicular to the one or more slits 1031. In some embodiments, the one or more slits 1032 and the one or more slits 1031 are not connected.

In some embodiments, the one or more slits 1032 along the second direction may be set on either longitudinal side of the one or more slits 1031. As used herein, the longitudinal side may refer to a side in front of or behind the slit in the direction along the length of the slit. In some specific embodiments, as shown in FIG. 10, the one or more slits 1032 may be set on both longitudinal side of the one or more slits 1031. Such a pattern may be set according to the phenomenon that, eddy currents in the central part of a metallic layer are generally weaker than eddy currents in the edge parts of the metallic layer. As shown in FIG. 4, the metallic layer 1020 may have four slits 1031 that are substantially parallel to the longer sides of the metallic layer 1020. Adjacent slits of the four slits 1031 may have equal spatial distances. The metallic layer 1020 may also have two slits 1032 that are substantially parallel to the width direction of the metallic layer 1020. The two slits 1032 may be set near the shorter sides of the metallic layer 1020 respectively. The two slits 1032 may also be on the longitudinal sides of the one or more slits 1031. It is noted that, FIG. 10 is only provided for demonstration purposes and not intended to be limiting. For example, the numbers of the first slit(s) 1031 and the second slit(s) 1032 may be other proper numbers. As another example, the one or more slits 1032 may be set on one longitudinal side only.

Figure 11:
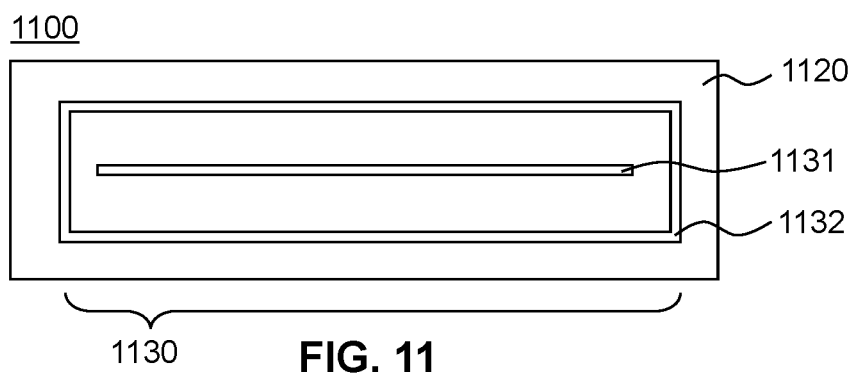
FIG. 11 is a schematic diagram illustrating an exemplary pattern for setting slits on a metallic layer according to some embodiments of the present disclosure.

FIG. 11 is a schematic diagram illustrating an exemplary pattern 1100 for setting slits 1130 on a metallic layer 1120 according to some embodiments of the present disclosure. The slits 1130 and the metallic layer 1120 may be examples of the slits 430 and the metallic layer 420, respectively. For example, the slits 1130 may include one or more slits 1132 in the form of rectangular rings or any other enclosing shapes (or a part thereof). Optionally, the slits 1130 may also include one or more strip-like slit 1131. In some embodiments, as shown in FIG. 11, the one or more slit 1131 may be set inside the slits 1132.

Figure 12:
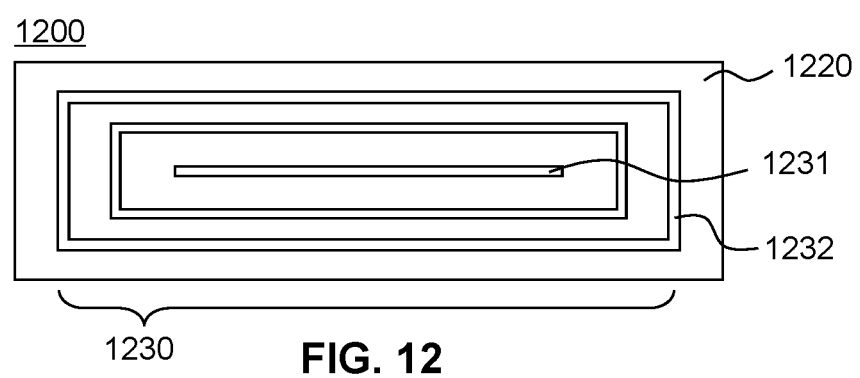
FIG. 12 is a schematic diagram illustrating an exemplary pattern for setting slits on a metallic layer according to some embodiments of the present disclosure.

FIG. 12 is a schematic diagram illustrating an exemplary pattern 1200 for setting slits 1230 on a metallic layer 1220 according to some embodiments of the present disclosure. The slits 1230 and the metallic layer 1220 may be examples of the slits 430 and the metallic layer 420, respectively. The slits 1230 may include a plurality of slits 1232 forming nested enclosing shapes, such as nested rectangular rings. Optionally, the slits 1130 may also include at least one strip-like slit 1231. For example, the at least one slit 1231 may be set inside at least one rectangular ring of the nested rectangular rings. In some embodiments, as shown in FIG. 12, the at least one slit 1231 may be set inside the innermost rectangular ring (or any other enclosing shape).

In some embodiments, the basic housing 410, or one or more substrate walls thereof, may be made of carbon-fiber-based material(s). In some specific embodiments, all the substrate walls of the basic housing 410 may be plates made of carbon-fiber-based material(s). As carbon fibers may be electrically conductive, the shielding performance of the housing 400 may be further increased, and the imaging performance of the MR-PET scanner 110 may be further improved. Meanwhile, carbon-fiber-based materials usually have good mechanical strength and may have a stronger ability to withstand pressure. Therefore, the housing 400 may be more durable and may have extended service life.

In some embodiments, one or more metallic layers 420 may be metallic films formed by spraying the corresponding metallic material(s) using a detonation spraying technique. It is noted that the detonation spraying technique is a thermal spraying approach. During the spraying, as the operating temperature is very high, the metallic material(s) may be fully melted. As a result, the resulting metallic film may be more closely attached to the substrate wall or a previously formed layer of the slit wall, and the resulting metallic film may have better electric conductivity, thereby improving the shielding performance of the housing 400 and the imaging performance of the MR-PET scanner 110.

In some embodiments, one or more metallic layers 420 may be a copper film or an aluminum film. A copper-made metallic layer 420 may have a better electric conductivity and may improve the shielding performance of the housing

400. An aluminum-made metallic layer 420, due to the lower melting point and the lower commercial cost of aluminum, may be easier to be formed and have a low cost.

Figure 13:
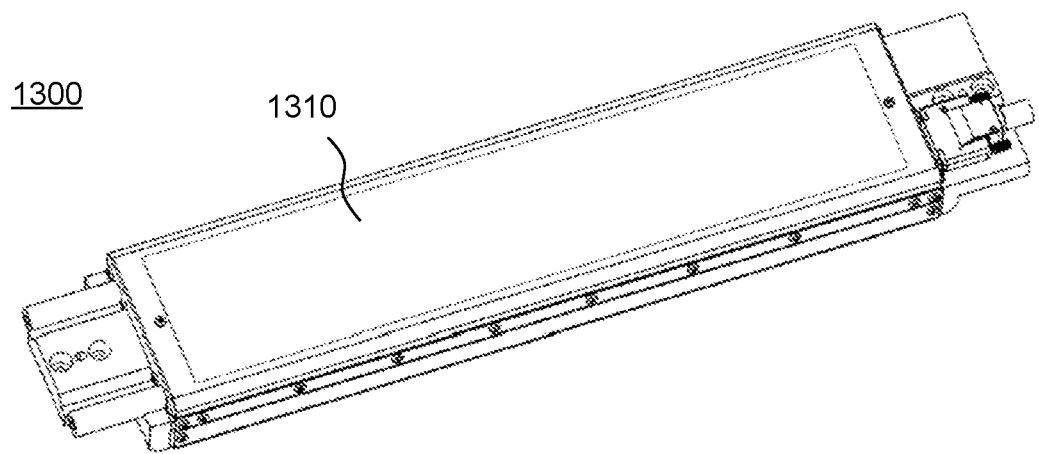
FIG. 13 is a schematic diagram illustrating an exemplary PET detection module according to some embodiments of the present disclosure.

FIG. 13 is a schematic diagram illustrating an exemplary PET detection module 1300 according to some embodiments of the present disclosure. The PET detection module 1300 may be an example of the PET detection module 230 or 310. The PET detection module 1300 may have a rectangular housing, which may enclose one or more PET detection units. The housing may also include a data communication interface for transmitting the electric signals generated by the one or more PET detection units.

The housing may also include a mounting structure configured to mount the housing, or the PET detection module 1300, on the MR-PET scanner 110. The mounting structure may be or may include, for example, a slot, a hole, a block, a screw, a bolt, a clamp, or the like, or a combination thereof. In some embodiments, the mounting structure may be used to mount the PET detection module 1300 on the mounting section 301 or the supporting component 300 illustrated in FIG. 3.

One or more walls of the housing of the PET detection module 1300, such as the wall 1310 and its opposite wall, may be a slit wall of any embodiment of the present disclosure. In some embodiments, the wall 1310 may have a configuration the same as or similar to the one illustrated in FIG. 8, and the metallic layers thereof may each have a slit pattern the same as or similar to the one illustrated in FIG. 10. Such a configuration may greatly reduce the eddy effect of the housing, decrease the heat caused by the eddy effect, and may have a good shielding performance towards the RF field generated by the magnet assembly 220 and the gradient coil of the MR-PET scanner 110, thereby improving the imaging performance and extending the service life of the MR-PET scanner 110.

Figure 14:
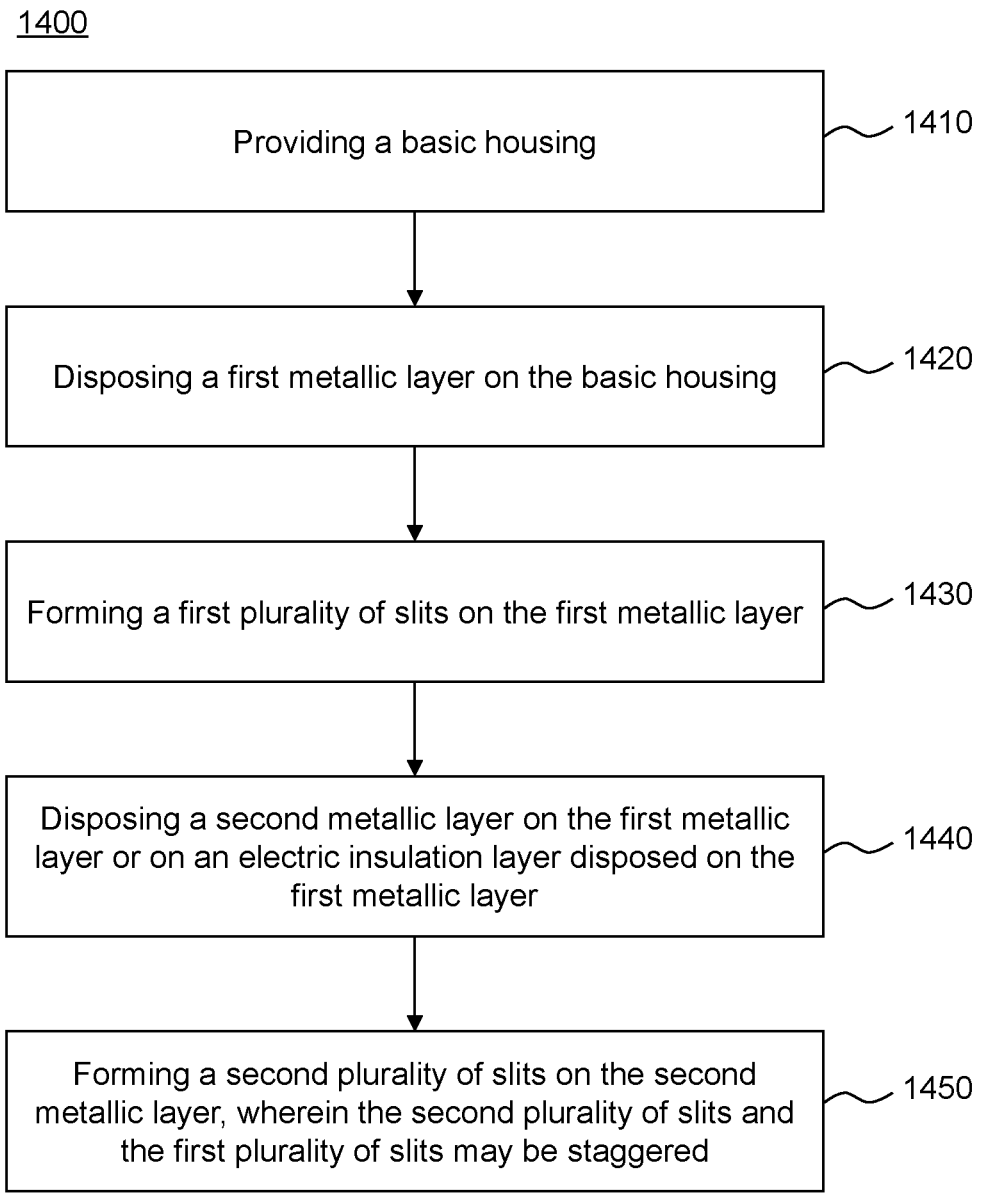
FIG. 14 is a flowchart illustrating an exemplary process for manufacturing a housing according to some embodiments of the present disclosure.

FIG. 14 is a flowchart illustrating an exemplary process 1400 for manufacturing a housing according to some embodiments of the present disclosure. The housing may be of any embodiment of the present disclosure. For example, the housing may be the one illustrated in FIG. 13. The housing may include a plurality of walls forming at least a part of a cavity for accommodating an electric instrument, such as a sensor or detector (e.g., one or more PET detection units). At least some of the plurality of walls may be the aforementioned slit walls.

In 1410, a basic housing (e.g., the basic housing 410) may be provided. The basic housing may extend along a first direction. For example, the first direction may be the length direction of the basic housing. The material of the basic housing is not limited in the present disclosure. In different embodiments, the basic housing may be made of or include epoxy fiberglass, epoxy resin, carbon fibers, or the like, or a combination thereof.

After the basic housing is provided, a multi-layered structure may be formed on the substrate wall corresponding to each slit wall. The multi-layered structure may include a plurality of metallic layers. The forming of the multi-layered structure for each slit wall is described as following.

In 1420, a first metallic layer may be disposed on the basic housing. Specifically, the first metallic layer may be disposed on the substrate wall (or be referred to as a substrate) corresponding to the slit wall. The first metallic layer may be disposed on the outer surface of the substrate wall using various approaches, as long as the first metallic layer may be bound to the substrate wall. For example, the first metallic layer may be disposed on the substrate wall via a thermal spraying technique, an adhesion technique using an adhesive, a pressure-lamination technique using corresponding equipment, or the like, or a combination thereof. The first metallic layer may include at least one material of gold, silver, copper, or aluminum, or the like, or an alloy thereof. In some embodiments, the first metallic layer may be a metallic film formed using a thermal spraying technique, such as a detonation spraying technique, or a plasma spraying technique.

In 1430, a first plurality of slits may be formed on the first metallic layer. The first plurality of slits may be formed according to any one of the slit patterns described in the present disclosure, such as the one illustrated in FIG. 9, FIG. 10, FIG. 11, or FIG. 12. The specifically adopted slit pattern is not limited in the present disclosure, as long as the slits set on the first metallic layer can cut the closed loops of the eddy currents.

In 1440, a second metallic layer may be disposed on the first metallic layer, or on an electric insulation layer disposed on the first metallic layer. In some embodiments, a first electric insulation layer may be first disposed on the first metallic layer, then the second metallic layer may be disposed on the first electric insulation layer. In some embodiments, the approach for disposing the second metallic layer may be the same as that for disposing the first metallic layer.

In 1450, a second plurality of slits may be formed on the second metallic layer, wherein the second plurality of slits and the first plurality of slits may be staggered to prevent the leakage of electromagnetic waves. The second plurality of slits and the first plurality of slits may be formed according to the same slit pattern, similar slit patterns, or different slit patterns, as long as the metallic part of the second metallic layer with the second plurality of slits can cover the first plurality of slits. In some embodiments, the slit pattern of the second plurality of slits may be the same as or similar to that of the first plurality of slits.

In some embodiments, after the operation 1450, a third metallic layer may be disposed on the second metallic layer, or an electric insulation layer disposed on the second metallic layer. In some embodiments, a second electric insulation layer may be disposed on the second metallic layer, and a third metallic layer may be disposed on the second electric insulation layer. After that, a third plurality of slits may be formed on the third metallic layer. The third plurality of slits and the second plurality of slits are staggered. The disposing process of the third metallic layer may be the same as or similar to that of the second metallic layer.

In some embodiments, after the outermost metallic layer is disposed, a protection layer may be disposed on the outermost metallic layer. In some embodiments, the protection layer and the first/second insulation layer may include the same material, and the disposing process of the protection layer may be the same as or similar to that of the first/second insulation layer.

In some embodiments, the whole basic housing may first be provided (e.g., via molding or assembling). Then the multi-layered structure may be formed on one or more surfaces of the basic housing. Other surfaces (if any) may be disposed with a single metallic layer without slits and optionally a protection layer.

In some embodiments, the substrate walls may be directly provided without being assembled to form the whole basic housing. Then the multi-layered structure may be formed on one or more walls to obtain one or more slit walls. Other substrate walls (if any) may be disposed with a single metallic layer without slits and optionally a protection layer. After that, the obtained walls may be assembled to form the housing.

In some embodiments, some of the substrate walls may be electrically conductive plates (e.g., a metal plate) directly, which may be referred to as conductive walls. There is no need to dispose metallic films on the conductive walls for RF field shielding. The conductive walls may be directly assembled with the slits walls to form the housing.

Having thus described the basic concepts, it may be rather apparent to those skilled in the art after reading this detailed disclosure that the foregoing detailed disclosure may be intended to be presented by way of example only and may be not limiting. Various alterations, improvements, and modifications may occur and are intended to those skilled in the art, though not expressly stated herein. These alterations, improvements, and modifications are intended to be suggested by this disclosure, and are within the spirit and scope of the embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment may be included in at least one embodiment of the present disclosure. Therefore, it may be emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that may be not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an subject oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, may be not intended to limit the claimed processes and methods to any order except as may be specified in the claims. Although the above disclosure discusses through various examples what may be currently considered to be a variety of useful embodiments of the disclosure, it may be to be understood that such detail may be solely for that purposes, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purposes of streamlining the disclosure aiding in the understanding of one or more of the various inventive embodiments. This method of disclosure, however, may be not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein may be hereby incorporated herein by this reference in its entirety for all purposes, excepting any prosecution file history associated with same, any of same that may be inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and describe.

We claim:

1. A housing for shielding a sensor in an imaging system, the housing comprising a plurality of walls forming at least a part of a cavity for accommodating the sensor of the imaging system, at least one of the plurality of walls including:
    a substrate; and
    a multi-layered structure disposed on the substrate, the multi-layered structure including a plurality of metallic layers, wherein at least one pair of adjacent layers of the plurality of metallic layers include slits, the slits of the at least one pair of adjacent layers form multiple enclosing shapes that are nested.

2. The housing of claim 1, wherein the slits of the at least one pair of adjacent layers are staggered.

3. The housing of claim 1, wherein the slits of the at least one pair of adjacent layers include:
    a plurality of first slits each of which extends along a first direction, and
    a plurality of second slits each of which extends along a second direction,
    wherein:
        the first direction and the second direction are different,
        the plurality of the second slits are set on either side of the first direction of the plurality of first slits, and
        two of the plurality of second slits and two of the plurality first slits together form an enclosing shape, or a portion thereof.

4. The housing of claim 1, wherein the multi-layered structure further includes an electric insulation layer between the at least one pair of adjacent layers.

5. The housing of claim 1, wherein the substrate includes carbon fibers.

6. The housing of claim 1, wherein the plurality of metallic layers include at least one material of gold, silver, copper, or aluminum.

7. The housing of claim 1, wherein the multi-layered structure further includes a protection layer disposed on an outermost layer of the plurality of metallic layers.

8. The housing of claim 1, wherein:
    the sensor is a positron emission tomography (PET) detector;
    the imaging system is a multi-modality imaging system; and
    the housing further includes a mounting structure configured to mount the housing on the multi-modality imaging system.

9. A magnetic resonance (MR)-positron emission tomography (PET) imaging system, comprising:
    a magnet assembly configured to generate a static magnetic field, wherein the magnet assembly forms a first hollow cylinder providing a first inner space;
    a radio frequency (RF) coil assembly configured to generate an RF field for MR imaging;
    a supporting component inside the first inner space; and
    a plurality of PET detection modules supported on the supporting component, each of the plurality of PET detection modules including:
        at least one PET detection unit; and
        a housing configured to shield the at least one PET detection unit from the RF field, wherein the housing includes a plurality of walls forming at least a part of a cavity for accommodating the at least one PET detection unit, and at least one of the plurality of wall includes:
            a substrate; and
            a multi-layered structure disposed on the substrate, the multi-layered structure including a plurality of metallic layers, the slits of the at least one pair of adjacent layers forming multiple enclosing shapes that are nested.

10. The MR-PET imaging system of claim 9, wherein:
    the supporting component forms a second hollow cylinder providing a second inner space;
    the plurality of PET detection modules are mounted on an outer surface of the second hollow cylinder; and
    the RF coil assembly is disposed in the second inner space.

11. The MR-PET imaging system of claim 9, wherein the slits of the at least one pair of adjacent layers are staggered.

12. The MR-PET imaging system of claim 9, wherein the slits of the at least one pair of adjacent layers include:
    a plurality of first slits each of which extends along a first direction, and
    a plurality of second slits each of which extends along a second direction,
    wherein:
        the first direction and the second direction are different,
        the plurality of the second slits are set on either side of the first direction of the plurality of first slits, and
        two of the plurality of second slits and two of the plurality first slits together form an enclosing shape, or a portion thereof.

13. The MR-PET imaging system of claim 9, wherein the multi-layered structure further includes an electric insulation layer between the at least one pair of adjacent layers.

14. The MR-PET imaging system of claim 9, wherein the substrate includes carbon fibers.

15. The MR-PET imaging system of claim 9, wherein the plurality of metallic layers include at least one material of gold, silver, copper, or aluminum.

16. The MR-PET imaging system of claim 9, wherein the multi-layered structure further includes a protection layer disposed on an outermost layer of the plurality of metallic layers.

17. A method for manufacturing a housing for shielding a sensor, the housing comprising a plurality of slit walls forming at least a part of a cavity for accommodating the sensor, wherein the method comprising:
    for each of the plurality of slit walls:
        providing a substrate of the slit wall; and
        forming a multi-layered structure on the substrate, the multi-layered structure including a plurality of metallic layers, wherein at least one pair of adjacent layers of the plurality of metallic layers include slits, the slits of the at least one pair of adjacent layers are staggered, the slits of the at least one pair of adjacent layers form multiple enclosing shapes that are nested.

18. The method of claim 17, wherein the slits of the at least one pair of adjacent layers include:
a plurality of first slits each of which extends along a first direction, and
a plurality of second slits each of which extends along a second direction,
wherein:
the first direction and the second direction are different,
the plurality of the second slits are set on either side of the first direction of the plurality of first slits, and
two of the plurality of second slits and two of the plurality first slits together form an enclosing shape, or a portion thereof.

19. The method of claim 17, wherein the forming a multi-layered structure includes:
disposing a first metallic layer on the substrate;
forming a first plurality of slits on the first metallic layer;
disposing a first electric insulation layer on the first metallic layer;
disposing a second metallic layer on the first electric insulation layer; and
forming a second plurality of slits on the second metallic layer.

20. The method of claim 19, wherein the forming a multi-layered structure further includes:
disposing a second electric insulation layer on the second metallic layer;
disposing a third metallic layer on the second electric insulation layer; and
forming a third plurality of slits on the third metallic layer, the third plurality of slits and the second plurality of slits being staggered.

\* \* \* \* \*